United States Patent [19]
Sato

[11] Patent Number: 6,097,082
[45] Date of Patent: *Aug. 1, 2000

[54] SEMICONDUCTOR DEVICE

[75] Inventor: Ryoji Sato, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/195,697

[22] Filed: Nov. 19, 1998

[30] Foreign Application Priority Data

Nov. 21, 1997 [JP] Japan ................................. 9-321476

[51] Int. Cl.[7] .................................................. H01L 23/495
[52] U.S. Cl. ............................ 257/668; 257/737; 257/778
[58] Field of Search ..................................... 257/668, 778, 257/737, 738

[56] References Cited

U.S. PATENT DOCUMENTS

| | | | |
|---|---|---|---|
| 5,334,875 | 8/1994 | Sugano et al. | 257/686 |
| 5,663,594 | 9/1997 | Kimura | 257/666 |
| 5,726,489 | 3/1998 | Matsuda et al. | 257/659 |
| 5,844,307 | 12/1998 | Suzuki et al. | 257/690 |

FOREIGN PATENT DOCUMENTS 7-321157  12/1995  Japan .

*Primary Examiner*—Carl Whitehead, Jr.
*Assistant Examiner*—Roy Potter
*Attorney, Agent, or Firm*—McGinn & Gibb, P.C.

[57] ABSTRACT

A ball grid array type semiconductor device comprises a bare chip, metal-filled through hole portions connected to internal electrodes of the bare chip, inner leads and a flexible tape carrier having external electrodes. The internal electrode of the bare chip has a length in a direction perpendicular to a side of the chip, which is three times or more the pitch of adjacent internal electrodes. The through hole portions are connected respectively to the internal electrodes so that the through hole portions are arranged in three or more rows. The inner lead led from the through hole portion in the intermediate row is spaced apart from an adjacent through hole portion so as not to interfere with it.

12 Claims, 5 Drawing Sheets

SEMICONDUCTOR DEVICE

BACKGROUND OF THE INVENTION

1. Field of the Invention

The present invention relates to a ball grid array type semiconductor device comprising a flexible tape carrier, more particularly, to a multipin semiconductor device having a narrow-pitched through hole connection structure.

2. Description of the Related Art

A ball grid array type semiconductor device comprising a flexible tape carrier is proposed in Japanese Patent Laid-open No. 7-321157 as an example. This discloses a micro semiconductor package, in which the size of a chip is nearly equal to that of a package.

As a fourth embodiment of this proposal discloses a structure, in which a metal-filled through hole is used as a connection between an internal electrode of a chip and an inner lead (see FIG. 5). Exemplary dimensions are as follows. For internal electrodes arranged in a single row at 100-$\mu$m pitch, a through hole of 50 $\mu$m in diameter and an inner lead of 70 $\mu$m in width are illustrated. A method for processing through holes, in which a carbonic acid gas, a YAG laser and an excimer laser is used, is disclosed.

In a seventh embodiment, the proposal also entions a limit to the number of outer electrodes which can be arranged in a portion, on which a bare chip is mounted, as shown in FIG. 5. As described in the embodiment, when external electrodes are arranged at a pitch of 0.5 mm, an external electrode mount area is 7 mm square, and the number of pins is 226 or more, pads cannot be formed in the mount area, so that the pads need to be arranged in a fan-out. Conversely, unlike a method such as a conventional TAB (Tape Automated Bonding), external electrodes can be also disposed on the portion on which a bare chip is mounted, resulting in improved area efficiency.

On the other hand, as the performance of semiconductor device is improved, a semiconductor package needs to be miniaturized and to have a multipin structure. Under such conditions, it is proposed that inner electrodes have a pitch of 40 $\mu$m or less and the number of outer electrodes is 500 pins or more.

Therefore, it appears that a semiconductor device having good area efficiencies, in which internal electrodes of a chip have a pitch of 40 $\mu$m or less, can be provided by employing the method disclosed in the Japanese Patent Laid-open No. 7-321157. However, the above mentioned method has a problem that it is difficult to connect internal electrodes at a narrow pitch of 40 $\mu$m.

The width of an internal lead at a connection between an inner lead and an internal electrode of a chip is determined by taking into account the diameter of a through hole and the clearances on the opposite sides thereof when a through hole is formed by means of laser or plating. However, actually, the smallest possible diameter of a hole formed by means of laser is about 25 $\mu$m and allowable diviation in the alignment of holes is 5–10 $\mu$m, and an hence the width of the inner lead becomes 35–45 $\mu$m, so that the width d of a gap between adjoining inner leads becomes about 0 as illustrated in FIG. 3, which may cause a short circuit.

As a wiring method, in which a short circuit can be avoided, an arrangement in which through hole portions of the inner leads are staggered, is also provided. However, in this case, as shown in FIG. 3, if two adjacent wires are arranged in the same direction, a short may occur. And when the adjacent wires are arranged in the opposite directions on staggered patterns, the number of wires which can be led onto the bare chip mounting area and the number of wires which can be led into a region outside the bare chip each are half or less the total number of internal electrodes of a chip. For example, when the area of the bare chip mounting portion has no room, and even if an attempt is made to lead more wires into the region outside the bare chip, it is impossible to lead the wires from a half or more of the total number of internal electrodes, as can be seen from FIG. 1.

SUMMARY OF THE INVENTION

An object of the present invention is to solve the above-described problems without the need to reduce a through hole diameter or a wire width, or to provide a wiring layer of a multilayered structure by a method as disclosed in Japanese Patent Laid-open No. 7-321157 and to provide a semiconductor device in which the wires can be bonded at a pitch as narrow as 40 $\mu$m, and the wires can be freely led from internal electrodes of chip onto or outside a bare chip mounting area, and a multipin structure and miniaturization can be achieved.

In order to achieve the above object, a semiconductor device according to the present invention of the ball grid array type comprises a bare chip, metal-filled through hole portions connected to internal electrodes of the bare chip, a wiring pattern, and a flexible tape carrier having external electrodes, wherein the internal electrodes are arranged perpendicularly to a side of the chip and adjacent to the side of the chip at a certain pitch, each of the through hole portions is connected to any one of the inner, intermediate, and outer portions of the internal electrode with respect to the chip so that the through hole portions are arranged on a staggered pattern, and a wire led from the intermediate portion of the internal electrode is spaced apart from the adjacent through hole portions so as not to interfere with the through hole portions. The wire led from the intermediate portion of the internal electrode is spaced from the adjacent through hole portion by a distance of at least 20 $\mu$m. The wire led from the through hole in an intermediate row of through holes can be led toward the inside of the chip.

According to the above-mentioned present invention, when an inner leads are wired from the internal electrodes of the chip to external electrodes, and all the internal electrodes disposed at a narrow pitch can be effectively used, it is possible to have a ratio of the number of inner leads wired onto the bare chip mounting area to the number of inner leads wired outside the bare chip at 3:1 or 1:3, with the degree of freedom being increased. It is therefore possible to provide a semiconductor device in which a narrow pitch, multipin structure and miniaturization can be achieved.

The above and other objects, features and advantages of the present invention will become apparent from the following description referring to the accompanying drawings which illustrate examples of preferred embodiments of the present invention.

DETAILED DESCRIPTION OF THE PREFERRED EMBODIMENTS

Figure 6:
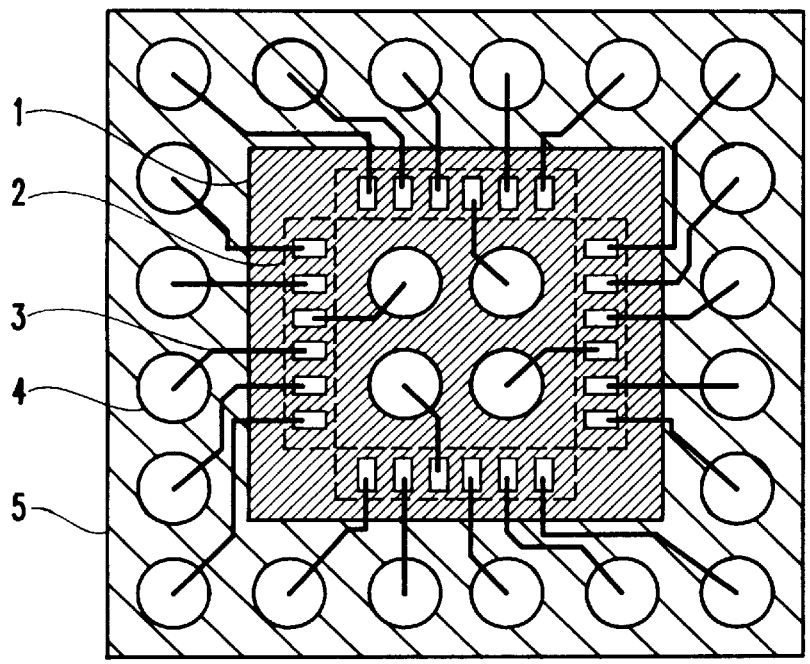
FIG. 6 shows the arrangement of external electrodes illustrating the first embodiment of the present invention.
Figure 7:
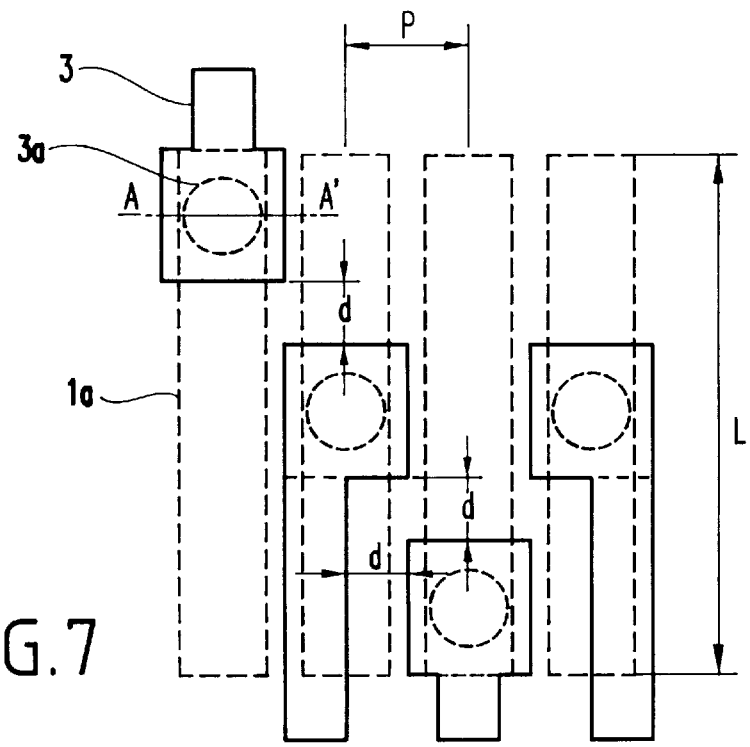
FIG. 7 shows a structure of internal electrodes of a chip and through hole connection portions in the present invention.
Figure 8:
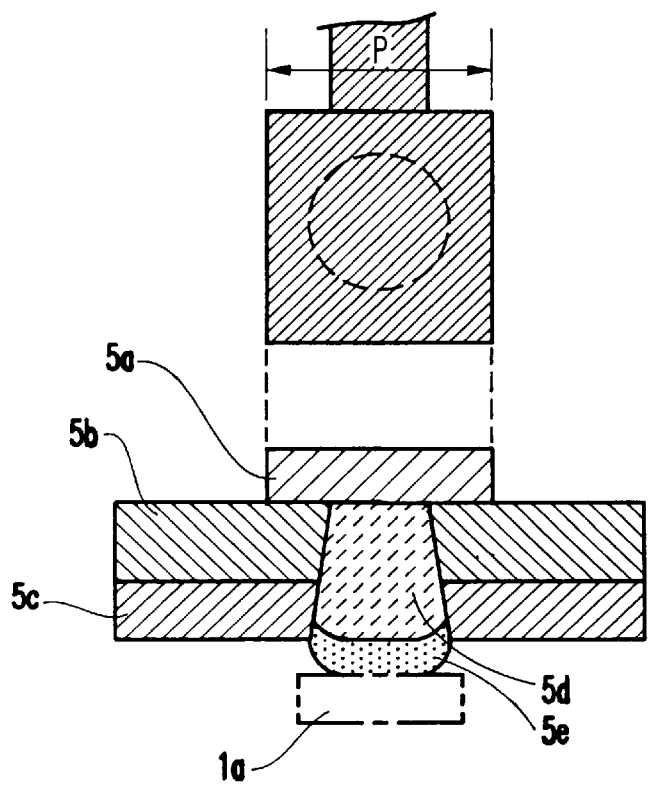
FIG. 8 is a top view and a cross sectional view taken on line A–A' of the through hole connection portions of FIG. 7.

A first embodiment of a semiconductor device of the present invention will be described below with reference to FIGS. 6 to 8. This embodiment will be described under the following assumption. Internal electrode pitch P on a chip is 40 μm. The diameter of a through hole at a through hole connection portion is 25 μm. The width of an inner lead at the through hole portion is 40 μm. The space d between wires is 20 μm. However, the actual present invention is not limited to these dimensions.

In the first place, the first embodiment of the present invention will be described with reference to FIGS. 6 to 8. This embodiment relates to a ball grid array type semiconductor device comprising a flexible tape carrier. The structure of through hole portions 5d and 5e of the tape carrier connected to an internal electrode 1a of a chip is shown in FIG. 8. The arrangement for leading wires from connection portions is shown in FIG. 7. First, a length L in a direction perpendicular to the pitch direction of internal electrode 1a is three times or more a pitch P of internal electrode pads. In this case, the length L is three times the pitch P of the pads of internal electrodes 1a plus a space d between adjacent leads. An actual dimension is 160 μm. Through hole portions 3a are alternately connected to the internal electrodes 1a in three or more rows. An inner lead 3 led from the through hole portion in the intermediate row of pads is led to the outside of the chip 1, and displaced sideward to the adjoining through hole portion by a distance of 10 μm so as not to interfere with it. As a result, the interval d between the adjoining leads is 20 μm.

That is, the leads are arranged in such a manner that side edges of a lead connected to a through hole in the intermediate row (including through hole connection portion 3a), opposed to the side edges of the adjacent leads are spaced from the side edges of the adjacent leads by a distance of at least 20 μm (a specific space which does not cause a short). The resultant arrangement of leads in the semiconductor device according to the present invention is shown in FIG. 6.

Figure 9:
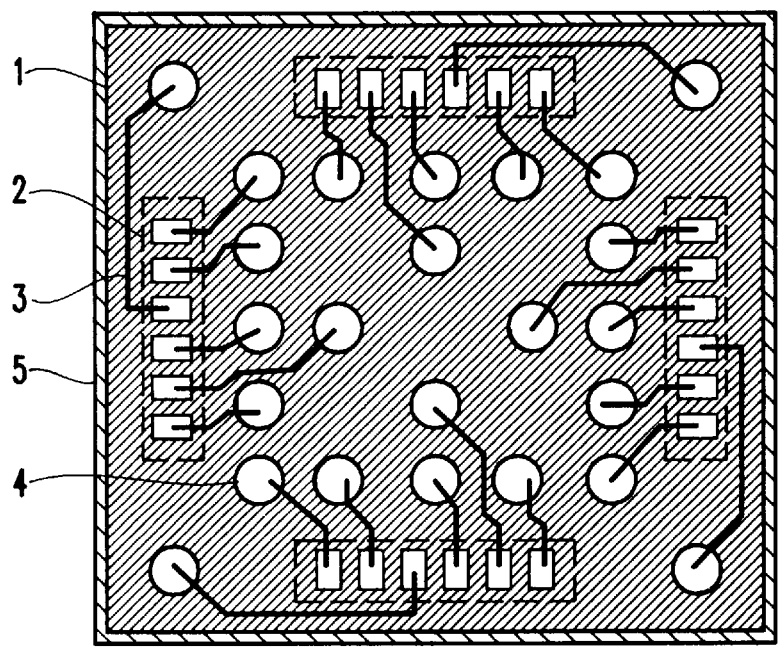
FIG. 9 shows the arrangement of the external electrodes illustrating the second embodiment of the present invention.

Next, a second embodiment of the present invention will be described. This embodiment also relates to a ball grid array type semiconductor device comprising a flexible tape carrier in the same manner as the first embodiment. The arrangement of leads is shown in FIG. 9. Here, as in the case of the first embodiment, the through hole portion connected to the internal electrode of a chip on a tape carrier has such a structure as shown in FIG. 8. The arrangement of the leads led from the connection portion is also shown in FIG. 7. However, the second embodiment differs from the first embodiment in the ratio of leads in the leading directions. That is, in the first embodiment, the number of leads led to the outside of the chip is larger than the number of leads led onto the area on which the bare chip is mounted, whereas, in the second embodiment, the number of wires led onto the area on which the chip is mounted is larger than the number of wires led to the outside of the chip. Consequently, the second embodiment differs from the first embodiment in that more outer electrodes are disposed on the mounting area of the chip.

A comparison between the aforementioned prior art and the first embodiment of the present invention is shown in Table 1. As shown in Table 1, as compared to the prior art, in the present invention, leads can be led from the internal electrodes onto the mounting area of chip or to the external electrodes outside the chip, and hence a multipin arrangement can be provided. That is, more external electrodes can be mounted in the same area, and by the use of the semiconductor device of the present invention, 50% or more of pins can be mounted in comparison to a staggered arrangement of the prior art.

TABLE 1

Figure 1:
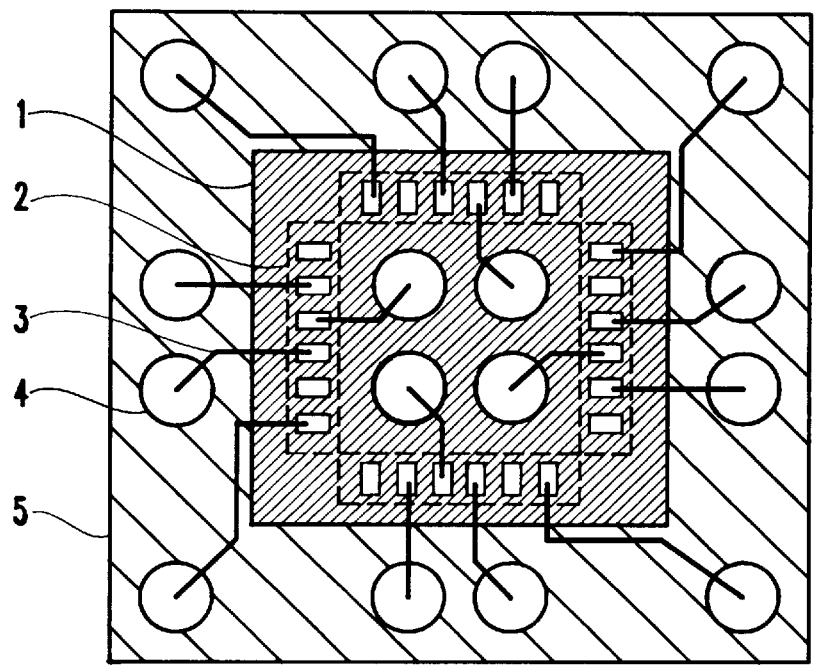
FIG. 1 shows an arrangement of external electrodes of the prior art (staggered arrangement)
Figure 2:
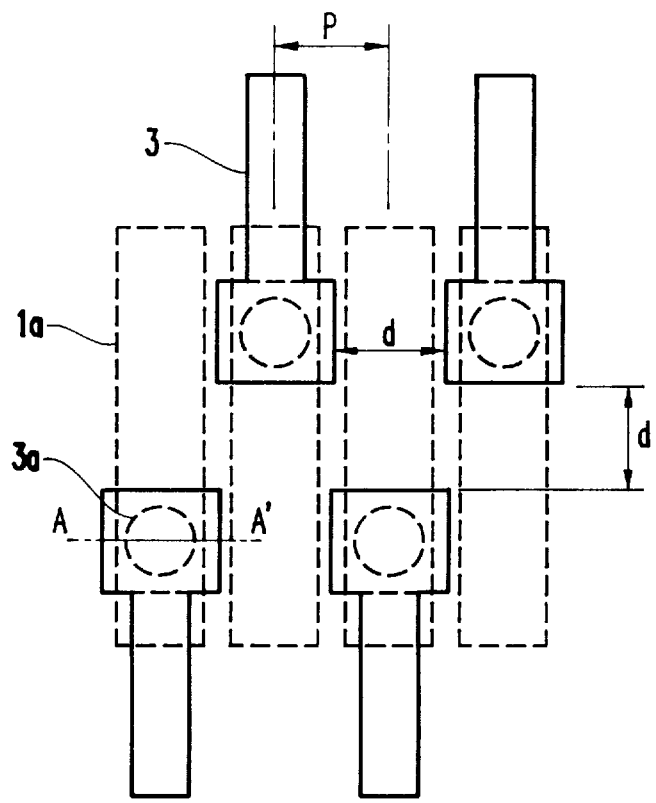
FIG. 2 is a partially expanded view of wiring area of FIG. 1.
Figure 3:
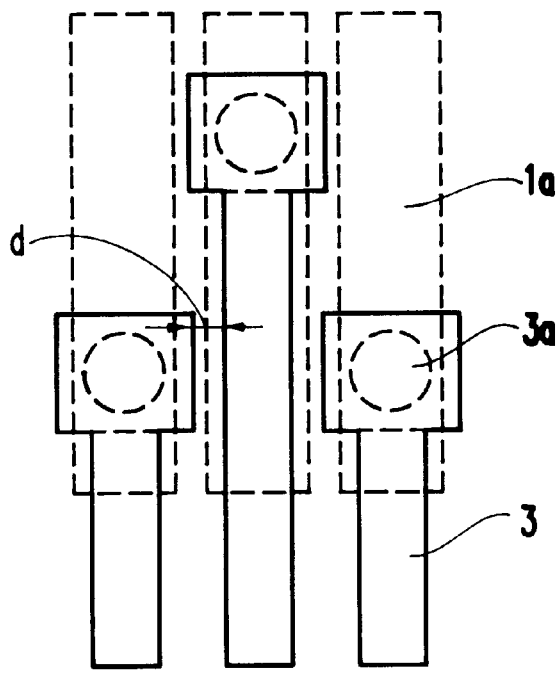
FIG. 3 is a partially expanded view showing the drawback of the wiring of the prior art.
Figure 4:
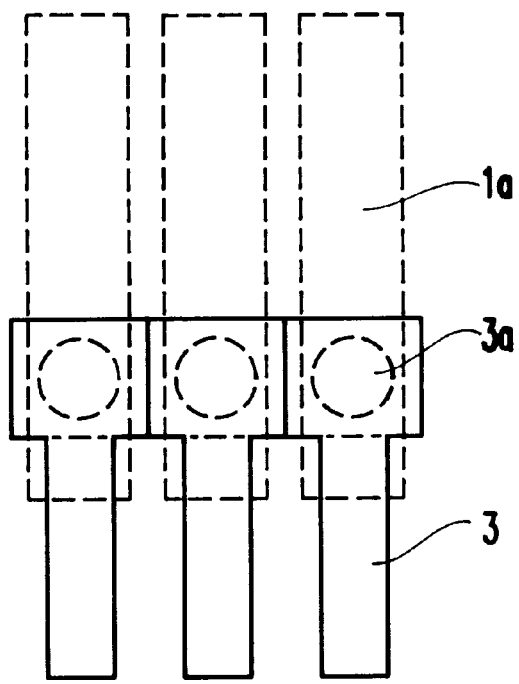
FIG. 4 is a partially expanded view showing the drawback of the wiring of the prior art.
Figure 5A:
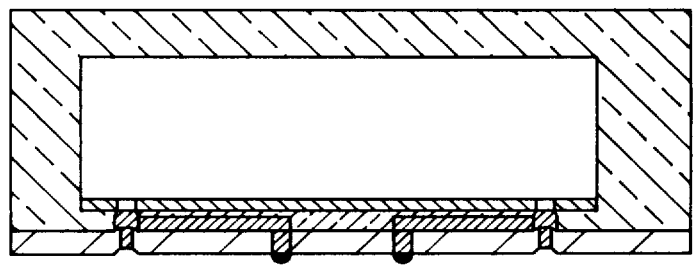
FIG. 5 shows the arrangement of external electrodes of the prior art.
Figure 5B:
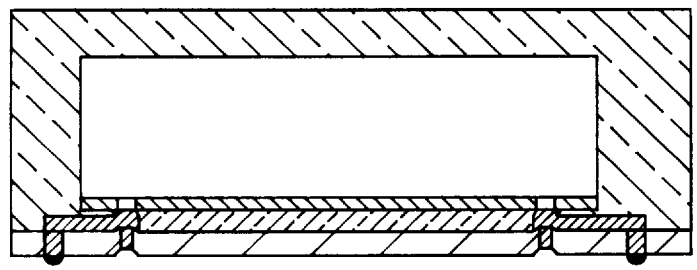
Figure 5C:
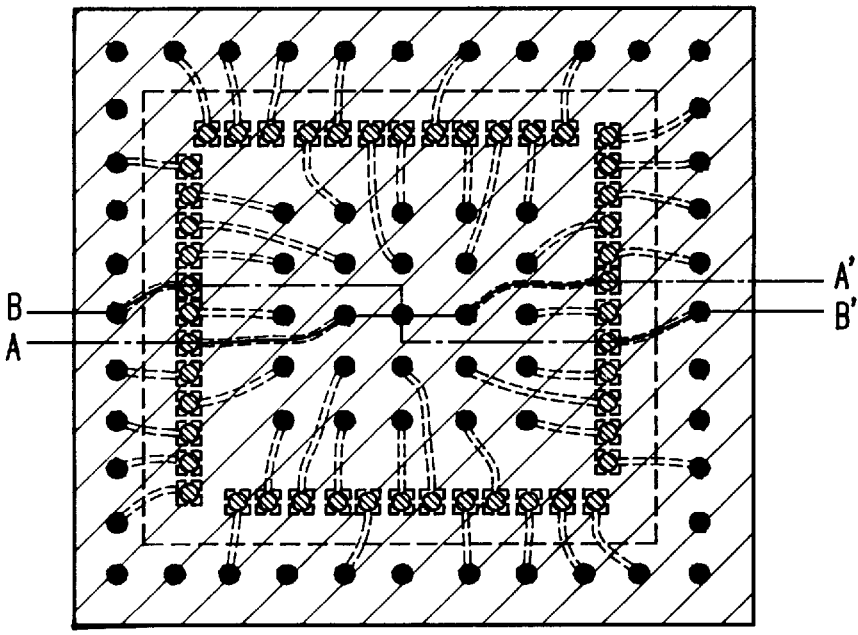

| | Comparison between the present invention and the prior art | | | | |
|---|---|---|---|---|---|
| | Number of chip electrodes (A) | Number of outer electrodes (B) | Bare chip mount area | Outside of bare chip | B/A |
| Present invention (FIG. 6) | 24 | 24 | 4 | 20 | 1 |
| Prior art (FIG. 1; staggered arrangement) | 24 | 16 | 4 | 12 | 0.67 |

In the present invention, an arrangement, in which more external electrodes are disposed outside the bare chip as shown in the first embodiment or an arrangement in which more external electrodes are disposed on the mounting area of the bare chip as shown in the second embodiment can be selectively employed.

It is to be understood that variations and modifications of the semiconductor device disclosed herein will be evident to those skilled in the art. It is intended that all such modifications and variations be included within the scope of the appended claims.

What is claimed is:

1. A semiconductor device of the ball grid array type comprising:

a bare chip and metal-filled through hole portions connected to internal electrodes of said bare chip, each internal electrode being on said bare chip and within an area defined by said bare chip including an inner portion located at one end of the electrode, an outer portion located at another end of the electrode and an intermediate portion located between the inner portion and the outer portion; and said internal electrodes including a first set of internal electrodes arranged perpendicularly to a first side of said bare chip and at a predetermined pitch in a direction along the first side of the bare chip, said internal electrodes including a second set of internal electrodes arranged perpendicularly to a second side of said bare chip and at the predetermined pitch in a direction along the second side of the bare chip, said first side being transverse to said second side, one of said through hole portions being connected to one of the inner portions of the first set of internal electrodes, one of said through hole portions being connected to one of the intermediate portions of the first set of internal electrodes and one of said through hole portions being connected to one of the outer portions of the first set of internal electrodes so that said through hole portions are arranged in a staggered pattern, a plurality of outer electrodes provided on said device outside said area defined by said bare chip;

an inner lead from the intermediate portion of said internal electrode being spaced apart from an adjacent through hole portion by such a distance as not to interfere with said adjacent through hole; and an outer lead that electrically connects one of said internal electrodes with one of said outer electrodes.

2. The semiconductor device according to claim 1, wherein the inner lead led from the intermediate portion of said internal electrode is spaced apart from an adjacent through hole portion by a distance of at least 20 µm.

3. The semiconductor device according to claim 1, wherein the inner lead led from the through hole portion in an intermediate row of through hole portions is laid toward the inside of the chip.

4. The semiconductor device of claim 1, wherein each inner electrode of the first set of inner electrodes extends a length L in a longitudinal direction from the inner portion to the outer portion, the inner electrodes being spaced at a pitch P in a direction perpendicular to the longitudinal direction, wherein the length L is at least three times longer than the pitch P of the inner electrodes.

5. The semiconductor device of claim 2, wherein each inner electrode of the first set of inner electrodes is spaced a distance d from an adjacent inner electrode of the first set of inner electrodes, wherein the length L of the inner electrodes is three times a total of the pitch P plus the distance d.

6. The semiconductor device of claim 1, wherein more of the inner leads connect with the through hole portions inside the bare chip than the inner leads that connect with the through hole portions outside the bare chip.

7. A semiconductor device comprising:

a bare chip having internal electrodes arranged perpendicularly to a side of said bare chip and through hole portions connected to the internal electrodes of said bare chip using hole connection portions, said internal electrodes being located within a first area of said device defined by said bare chip, each internal electrode including an inner portion, an outer portion and an intermediate portion located with respect to the bare chip, a first hole connection portion being connected to one of the inner portions of the internal electrodes, a second hole connection portion being connected to one of the intermediate portions of the internal electrodes and a third hole connection portion being connected to one of the outer portions of the internal electrodes so that said first, second and third hole connection portions are arranged in a staggered manner;

a plurality of external electrodes located within a second area of said device outside said first area of said device;

an inner lead led from the intermediate portion of said internal electrode being spaced apart from an adjacent through hole portion by such a distance as not to interfere with said adjacent through hole; and an outer lead extends from one of said inner electrodes to one of said external electrodes.

8. The semiconductor device according to claim 7, wherein the inner lead led from the intermediate portion of said internal electrode is spaced apart from an adjacent through hole portion by a distance of at least 20 µm.

9. The semiconductor device according to claim 7, wherein the inner lead led from the through hole portion in an intermediate row of the through hole portions is led toward the inside of the chip.

10. The semiconductor device of claim 7, wherein each inner electrode extends a length L in a longitudinal direction from the inner portion to the outer portion, the inner electrodes being spaced at a pitch P in a direction perpendicular to the longitudinal direction, wherein the length L is at least three times longer than the pitch P of the inner electrodes.

11. The semiconductor device of claim 10, wherein each inner electrode is spaced a distance d from an adjacent inner electrode, wherein the length L of the inner electrodes is three times a total of the pitch P plus the distance d.

12. The semiconductor device of claim 7, wherein more of the inner leads connect with the through hole portions inside the bare chip than the inner leads that connect with the through hole portions outside the bare chip.

* * * * *